United States Patent
Olgaard et al.

[11] Patent Number: 5,926,060
[45] Date of Patent: Jul. 20, 1999

[54] MIRROR MODEL FOR DESIGNING A CONTINUOUS-TIME FILTER WITH REDUCED FILTER NOISE

[75] Inventors: Christian Olgaard, Sunnyvale, Calif.; Ivan Riis Nielsen, Kobenhavn, Denmark

[73] Assignee: National Semiconductor Corporation, Santa Clara, Calif.

[21] Appl. No.: 08/644,467

[22] Filed: May 10, 1996

[51] Int. Cl.⁶ .............................. H03K 17/16; G05F 3/16
[52] U.S. Cl. .................... 327/538; 327/530; 327/552; 323/315; 323/312
[58] Field of Search .................... 327/524, 108, 327/512, 538, 540, 53, 66; 323/315, 312; 326/27

[56] References Cited

U.S. PATENT DOCUMENTS

| | | | |
|---|---|---|---|
| 4,032,839 | 6/1977 | Ahmed | 323/19 |
| 4,963,764 | 10/1990 | Quan | 327/109 |
| 5,334,929 | 8/1994 | Shade, Jr. | 323/315 |
| 5,459,430 | 10/1995 | Ryat | 327/538 |

*Primary Examiner*—Timothy P. Callahan
*Assistant Examiner*—Dinh Le
*Attorney, Agent, or Firm*—Skjerven, Morrill, MacPherson, Franklin, & Friel, LLP; Edward C. Kwok; Philip W. Woo

[57] ABSTRACT

A current mirror model is provided for designing a continuous-time filter with reduced filter noise. The current mirror model includes an input branch having a voltage $V_{in}$ across a series circuit including a voltage source and a resistor of resistance value $R_m$. The voltage source has a voltage value substantially equal to the value $4kTR_m$, where k is the Boltzmann constant and T is the temperature. An output branch is coupled to the input branch. The output branch has a first current source and a second current source. The first current source is controlled by the voltage $V_{in}$ and sources a current substantially equal to a transconductance $G_m$ of the output branch times the voltage $V_{in}$. The output branch transconductance $G_m$ has a transconductance value substantially less than a value of an input branch conductance $1/R_m$. The second current source, coupled in parallel to the first current source, sources a current substantially equal to the value $4kTG_m$.

1 Claim, 9 Drawing Sheets

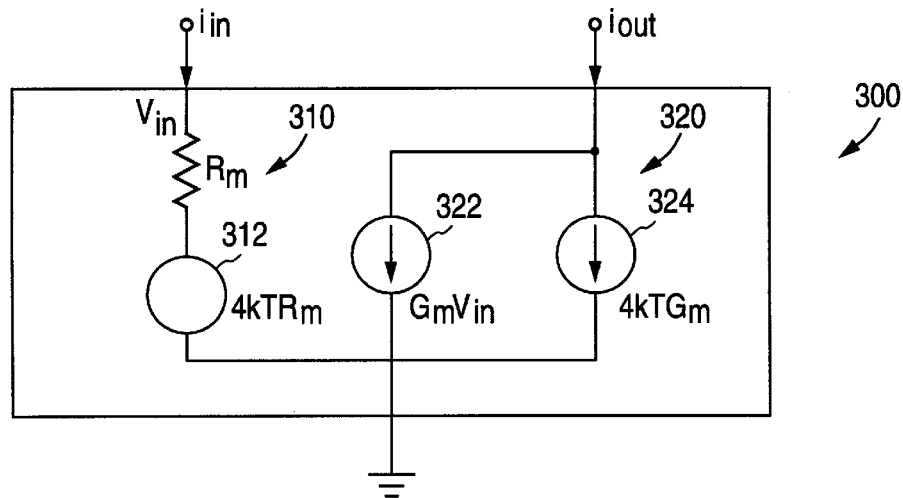
FIG. 3
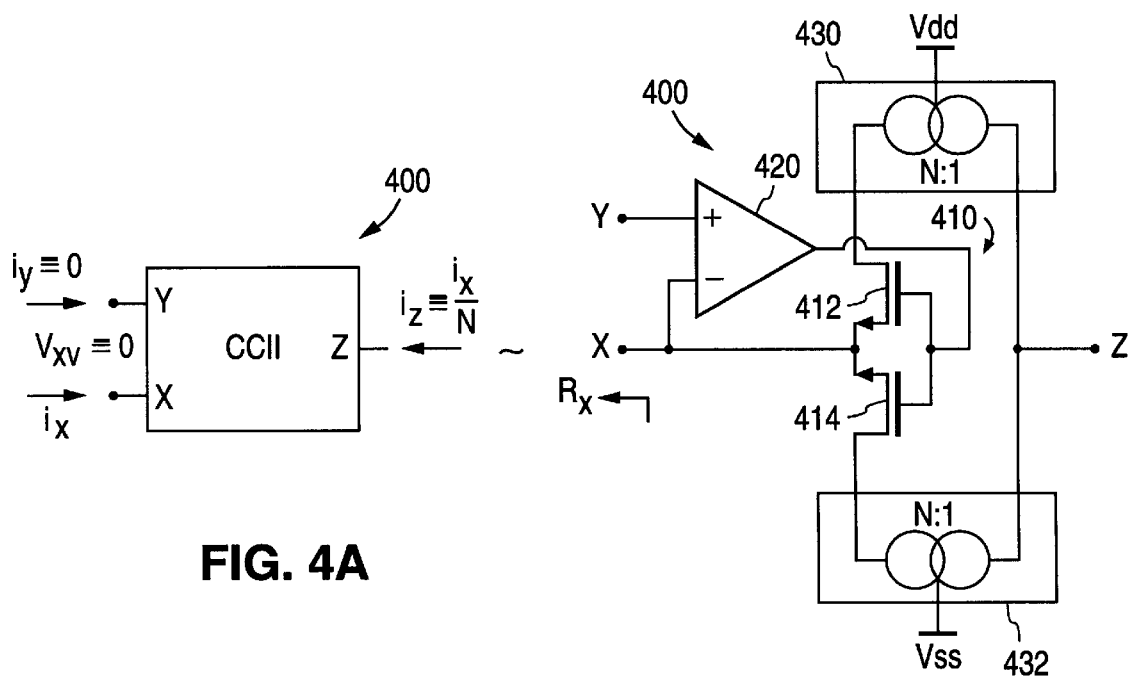
FIG. 4A
FIG. 4B

MIRROR MODEL FOR DESIGNING A CONTINUOUS-TIME FILTER WITH REDUCED FILTER NOISE

BACKGROUND OF THE INVENTION

1. Field of the Invention

The present invention relates to continuous-time filters. More specifically, the present invention relates to a continuous-time filter with improved noise performance by down-scaling current flowing into filter capacitors using current mirrors.

2. Description of the Related Art

The design of filters involves handling of a large, complex array of parameters and factors, many of which interact in complex manners. The design task often becomes more complicated when a filter is implemented as an integrated circuit due to the large variation in actual values of passive components even when relative matching of components is good. Several techniques have been proposed to overcome the problem of component value variation in an integrated circuit. Generally these techniques employ some type of electronic adjustment to compensate for variations.

A problem that arises in the design of continuous-time (C-T) integrated filters is the limited capacitor values that are available on an integrated circuit chip because of the area inefficiency of capacitors and resistors. Furthermore, the limited capacitor values have an impact on the noise performance of the filters since the noise generated by passive components in the filter is inversely proportional to the capacitor values.

One example of a filter is a well known first order lowpass filter, illustrated by a reference filter 100 shown in FIG. 1. The reference filter 100 includes an operational amplifier 110 having a noninverting input terminal connected to ground, an inverting input terminal and an output terminal connected to the inverting input terminal through a resistor R and a capacitor C which are connected in parallel. An input voltage is applied to the inverting input terminal via a resistor R. The transfer function of the reference filter is shown in an equation, as follows:

$$H(s) = \frac{-1}{sRC+1}.$$

If the operational amplifier is assumed to be noiseless then the input referred noise density is given in an equation, as follows:

$$\overline{v_{n,in}^2} = 4kT \cdot 2R$$

and the total output noise is determined as in an equation, as follows:

$$\overline{v_{n,out}^2} = \int_0^\infty \frac{4kT \cdot 2R}{(2\pi fRC)^2 + 1} df$$

$$= \frac{2kT}{C}.$$

Accordingly, for a sinusoidal input signal with a maximum amplitude of $V_{max,out}$ applied to the reference filter 100, the dynamic range is given by an equation, as follows:

$$DR = \frac{V_{rms,out}^2}{V_{n,out}^2}$$

$$= \frac{CV_{max,out}^2}{4kT}.$$

The dynamic range is independent of resistor values and depends only on the capacitor value and the maximum output voltage. To minimize noise of the filter, a large capacitor is typically chosen. The choice of a large capacitor value is generally not viable for an integrated C-T filter so that a designer is forced to make a compromise between integrated circuit chip area consumption and noise.

For a first order passive RC filter, the noise voltage is given by kT/C. Referring to the equation describing total output noise, $$\overline{v_{n,out}^2} = \frac{2kT}{C},$$

an active lowpass filter, even though assumed to have a noiseless active component (the operational amplifier), still generates a noise voltage of 2kT/C. The factor of two over the kT/C noise factor is related to filter topology. Other active filter topologies may be designed for low noise operation, but all merely approach but do not better the kT/C limit.

What is needed is a filter circuit and method of filter design that reduces filter noise below an apparently fundamental limit of kT/C for active filters.

SUMMARY OF THE INVENTION

In accordance with the present invention, a filter is designed which utilizes the inherent nonlinearity of current mirrors to obtain a high voltage gain in the quiescent state while constraining the large signal voltage gain to be below unity using a class A/B biasing scheme.

In accordance with one aspect of the present invention, a problem of limited on-chip capacitor values is addressed using a current scaling technique. For a capacitor current flowing into a first capacitor having a capacitance of NC and a capacitor current N times smaller flowing into a second capacitor having a capacitance of C, the first and second capacitors appear to be the same. Therefore, a capacitor appears to be N times larger if the current flowing into the capacitor is down-scaled by a factor N.

In accordance with another aspect of the present invention, a filter reduces noise in low frequency integrated continuous-time filters by down-scaling the current flowing into filter capacitors using current mirrors. The current mirrors include current mirror transistors having a suitably low transconductance so that the noise of the filter is substantially lower than the noise of a similar filter that does not use current-scaling. A low transconductance in the current mirror transistors is achieved by biasing the current mirrors at a suitable low level. Noise performance is enhanced by biasing the filter for class A/B operation.

The described method and circuit are highly advantageous in applications such as filters used in data acquisition in which a low noise and high dynamic range are paramount. The described method and circuit are also advantageous in applications employing a reduced supply voltage.

Many advantages are achieved by the described method and circuit. One advantage is that noise levels are substantially reduced. It is highly advantageously that the reduced noise levels are obtained by the MOS CCII class A/B implementations using a relatively small capacitor. The CCII– topology embodiments advantageously have separate output noise voltages from the input terminals of a filter so that added noise is relatively small. The current mirrors are advantageously designed so that the voltage across the output branches is slightly below half the supply voltage VDD thus establishing a suitable voltage margin. It is highly advantageous that the described method furnishes an implementation of a low noise filter with a given noise performance, using a smaller chip area than the area consumed using a conventional approach which has the same noise performance. Thus, the described technique allows a given low-noise filter performance to be achieved in a smaller area.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

FIG. 3 is a schematic block diagram which illustrates a generic current mirror model in accordance with the present invention.

FIGS. 4(A) and 4(B) illustrate a symbol and a schematic block diagram of a current scaling current conveyor type II (CCII) circuit topology.

DETAILED DESCRIPTION OF THE PREFERRED EMBODIMENTS

Figure 2:
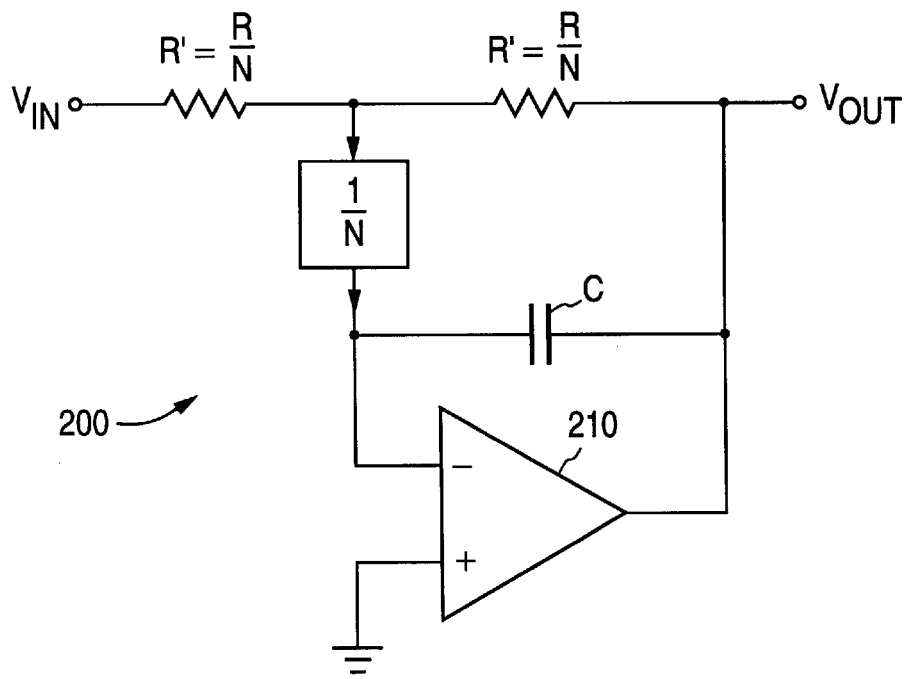
FIG. 2 is a schematic circuit diagram illustrating a modified lowpass filter using a filter topology employing current scaling.

Referring to FIG. 2, a schematic circuit diagram illustrates a modified lowpass filter 200 using a filter topology employing current scaling. The lowpass filter 200 has a capacitor C and a filter resistance R' connected in parallel with the capacitor C between an output terminal and an inverting input terminal of an operational amplifier 210. Current scaling is used to reduce the filter resistance R' by a scaling factor N (R'=R/N). The operational amplifier 210 has a virtual ground connection to a noninverting input terminal. A input referred noise density of the modified filter topology is given by equation as follows:

$$\overline{v_{n,in}^2} = 4kT \cdot 2R' + \overline{v_{n,in,1/N}^2}$$
$$= 4kT \cdot \frac{2R}{N} + \overline{v_{n,in,1/N}^2}$$

where $v_{n,in,1/N}$ is the noise of a circuit implementing the current scaling which is referred to the input terminal of the filter 200. Noise improvement is gained by current scaling if the noise contribution from the current scaler is less than the gained noise improvement from the usage of smaller filter resistor values.

Multiple illustrative embodiments of noise-improved low-frequency continuous-time filters are described and analyzed to illustrate a method of noise improvement beyond the "kT/C limit". For purposes of illustration and analysis, the lowpass filter 200 is used as a basic topology for applying the noise improvement method. For purposes of analysis, the lowpass filter 200 and modified filters based on lowpass filter 200 are first order 100 Hz lowpass filters using a 100 pF feedback capacitor (C), a single 5 V supply (VDD-VSS) and a current scaling factor (N) of 100. Values of resistors R are determined from the feedback capacitance C (100 pF) and from a cutoff frequency (100 Hz) to be 15.9 MΩ. The maximum capacitor current $I_{max}$ occurs for a rail-to-rail step response and has a theoretical value, $I_{max} = \Delta V_{in}/R = 5V/15.9 \text{ M}\Omega = 314 \text{ nA}$.

Referring to FIG. 3, a schematic block diagram illustrates a generic current mirror model 300 which describes the function of a current mirror utilized for current scaling of capacitor current, thereby reducing noise, improving dynamic range and reducing integrated circuit area. The generic current mirror model 300 is also useful for analysis of a current mirror implementation to facilitate estimation of circuit noise behavior. The generic current mirror model 300 includes an input branch 310 which is functionally equivalent to a resistor $R_m$ and an output branch 320 which is functionally equivalent to a current source 322 controlled by the voltage $V_{in}$ across the input branch 310. In particular, the current source 322 sources a current of $G_m V_{in}$, the output branch transconductance $G_m$ times the voltage $V_{in}$. Thermal noise affects the input branch 310 in a manner functionally similar to a voltage source 312 connected in series with the resistor $R_m$ and a thermal voltage of $4TR_m$. Thermal noise affects the output branch 320 in a manner functionally similar to a current source 324 connected in parallel with the current source 322 and sourcing a current of $4kTG_m$. The ratio of the input branch conductance $1/R_m$ to the output branch transconductance $G_m$ is the scaling-down factor N. The generic current mirror model 300 achieves a low noise when the output branch transconductance $G_m$ is low and the impedance level of the resistor $R_m$ is high, which is equivalent to a high voltage swing, at the mirror input branch 310.

The generic current mirror model 300 facilitates a determination of output referred noise current density in accordance with a following equation:

$$\overline{i^2_{n,out}} = 4kT(G_m + G_m^2 R_m)$$
$$= 4kT(G_m + G_m/N)$$
$$\cong 4kTG_m$$

where $R_m = 1/NG_m$ and N is the scaling factor of the current conveyor CCII.

FIG. 4(A) shows a symbol of a down-scaling current conveyor (CCII) and illustrates the ideal behavior of a current scaling (N:1) CCII circuit. To illustrate the application of the generic current mirror model 300, the topology of the current scaler 400 is selected to be a current scaling current conveyor type II (CCII) topology. The current scaler 400 maintains a virtual ground between a low impedance X-terminal and a high impedance Y-terminal. Current flowing in a current-output Z-terminal is N times smaller than the current flowing in the X-terminal. Two variations of the CCII circuit exist including a CCII+ circuit in which current flowing into the X-terminal causes the Z-terminal to sink current and a CCII− circuit in which current flowing into the X-terminal causes the Z-terminal to source current. Multiple various topologies may be used to implement a current scaler in accordance with the generic current mirror model 300.

Referring to FIG. 4(B), a schematic block diagram illustrates a simplified topology of a CCII+ current scaler 400 which operates on the basis of current sensing. Two MOS transistors 412 and 414 operate as a class A/B output stage 410 of an output-buffered operational amplifier 420. Current transfer is achieved by steering an input current into the low impedance of the sources of the two MOS transistors 412 and 414. The operational amplifier 420 controls the gate voltage of the two MOS transistors 412 and 414 so the voltage at the X-terminal remains substantially identical to the voltage at the Y-terminal.

Noise performance of a filter depends on the noise performance of the CCII+0 current scaler 400. Two aspects of the operation of the CCII+ current scaler 400 result in the generation of noise. A first aspect arises because the X-terminal voltage is not precisely equal to the Y-terminal voltage as indicated in FIG. 4(A). Instead, a small difference voltage between the X and Y-terminal voltages, called an input referred noise voltage $v_{nXY}$, contributes to the Z-terminal current with an incremental current value of $v_{nXY}/NR_X$, where $R_X$ is the external impedance seen from the X-terminal. A second aspect arises because the Z-terminal current differs slightly from 1/N times the X-terminal current by some small amount, called an output referred noise current $i_{nZ}$.

The input referred noise voltage $v_{nXY}$, if significantly smaller than the thermal noise voltage of resistor $R_X$, may be ignored. For low frequency filters, the filter resistance is large even when current is scaled, suggesting that the thermal noise of the resistor $R_X$ dominates the input referred noise voltage $v_{nXY}$. A typical value of input referred noise voltage is approximately $20n V/\sqrt{Hz}$ so that the resistor noise of a filter dominates the input noise referred voltage $v_{nXY}$ if the resistor values are well above about 50 KΩ. Therefore, if the operational amplifier 420 is a low noise amplifier, only the second aspect of the noise, specifically the output referred noise current $i_{nZ}$, substantially affects the noise level. For a CCII+ circuit having an operational amplifier 420 with MOS input terminals and insignificant gate currents, the operational amplifier 420 and the MOS transistors 412 and 414 have no effect on the output referred noise current $i_{nZ}$ because the sum of the input current to current mirror 430 plus the input current to current mirror 432 is equal to the input current $i_X$, according to Kirchoff's current law. Accordingly, the primary source of noise in the CCII+ circuit is the output current mirrors 430 and 432.

The output current mirrors 430 and 432 are designed to have equal output transconductances of $G_m$ in a quiescent state. Because the output current mirrors 430 and 432 are the main noise contributors in the CCII+ topology shown in FIGS. 4(A) and 4(B), the noise behaviors of the output current mirrors 430 and 432 is estimated by the equation, $\overline{i^2_{n,out}} = 4 kTG_m$. The power density of the output referred noise current $i_{nZ}$ is the sum of the currents of output current mirrors 430 and 432. In the quiescent state, referring the output referred noise current $i_{nZ}$ back to the filter input gives an equation, as follows:

$$\overline{v^2_{n,in,1/N}} = \frac{2 \cdot 4kTG_m}{\left(\frac{1}{N} \cdot \frac{1}{R'}\right)^2}$$
$$= 8kTG_m R^2.$$

Solving equations and comparing the results gives inequality, as follows:

$$\frac{1}{N} + G_m R < 1.$$

The current scaler 400 is designed so that the number N is large so that the value $G_m R$ is the main determinant of noise performance. Referring to FIG. 2 in combination with FIG. 3, the value $1/G_m R$ is equal to the open loop voltage gain from the input terminal of the filter 200 to the input to the current mirror 300. Thus an improvement in noise performance is achieved by making the voltage gain $1/G_m R$ larger than unity, apparently limiting the signal handling capability of a filter because the voltage swing at the input to the current mirror 300 is limited by the VDD and VSS supply rails. However, a filter is designed which utilizes the inherent nonlinearity of current mirrors to obtain a high voltage gain in the quiescent state while constraining the large signal voltage gain to be below unity using a class A/B biasing scheme.

Figure 5A:
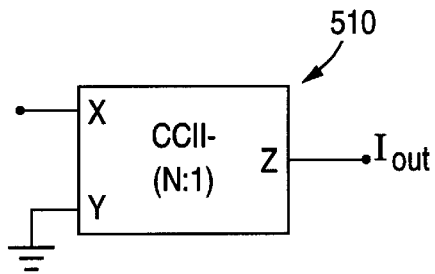
FIGS. 5(A), 5(B) and 5(C) are schematic diagrams showing two configurations of a CCII– topology down scaling current conveyor and a symbol which designates a CCII– topology circuit.
Figure 5C:
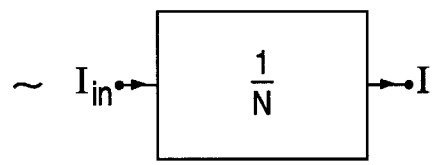
Figure 5B:
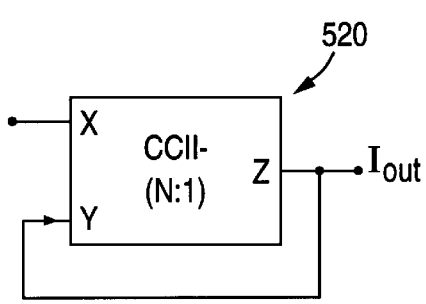

Referring to FIGS. 5(A) and 5(B), two configurations 510 and 520 of a CCII− topology down scaling current conveyor are respectively shown. FIG. 5(C) illustrates a symbol which designates a CCII− topology circuit. A CCII− version of the generic current mirror model 300 shown in FIG. 3 is implemented by passing the current through extra 1:1 current mirrors. Similarly, the current scaler 200 shown in FIG. 2 is implemented using a current scaling CCII− topology in either of the configurations 510 and 520. CCII− topology configuration 510 has an advantage that the noise voltage at the output Z-terminal, which corresponds to the virtual ground node 212 in the topology shown in FIG. 2, is not passed back to the input terminal so that the added noise is smaller. Furthermore, the CCII− topology configuration 510 has a straightforward implementation which is directly used in the filter topology of filter 200.

CCII− topology configuration 520 has an advantage of a more universal application since the voltage at the X-terminal is equal to the voltage at the capacitor terminal so that the CCII− topology configuration 520 is useful for filter topologies in which the capacitor is not connected to a virtual ground reference.

Other various topologies are known for implementing a down scaling current conveyor CCII. However, a topology which is suitable for implementing filters in both BiCMOS and CMOS technologies is more useful. Furthermore, a topology that is suitable for class A/B filter operation is most useful for improving the noise performance of a current scaler.

Figure 6:
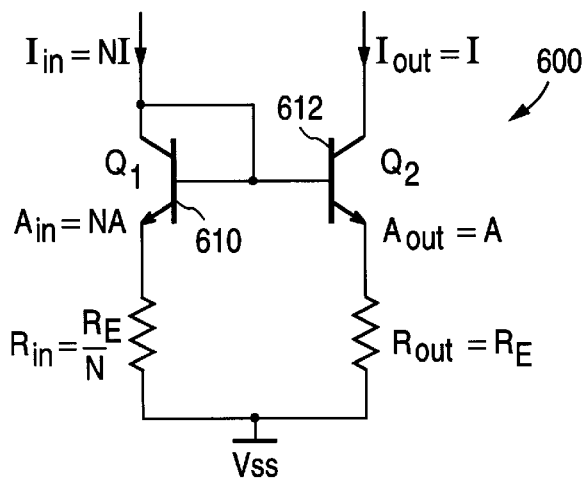
FIG. 6 depicts a schematic block diagram illustrating a degenerated bipolar down scaling current mirror having a down scaling factor N.

Referring to FIG. 6, a schematic block diagram illustrates a degenerated bipolar down scaling current mirror 600 having a down scaling factor N. Analysis of the generic current mirror model 300 hereinabove illustrates that a noise improvement is achieved by reducing the transconductance $G_m$ of the current mirror. One method of reducing transconductance $G_m$ is to add an emitter degeneration resistor.

In nondegenerated current mirrors, a mirror ratio is set by scaling the emitter areas as desired. In degenerated current mirrors, a mirror ratio is established by scaling the emitter resistors. However, if the current mirror ratio is to be independent of the current, then emitter area scaling is also employed. The degenerated bipolar current mirror 600 includes a first NPN transistor Q1 610 having a collector supplying an input current $I_{in}$=NI, a base connected to the collector, and an emitter connected to a VSS power source through a resistor $R_{in}$=$R_E$/N. The degenerated bipolar current mirror 600 also includes a second NPN transistor Q2 612 having a collector carrying an output current $I_{out}$=I, a base connected to the base of the first NPN transistor Q1 610, and an emitter connected to the VSS power source through a resistor $R_{out}$=$R_E$. The degenerated bipolar current mirror 600 is designed so that N is large and the emitter-to-collector gain $\alpha^2$ is close to 1. A first-order approximation to the output referred noise current $i_{nZ}$ is given by an equation, as follows:

$$\overline{i^2_{n,out}} = \overline{i^2_{n,out,w}} + \overline{i^2_{n,out,f}}$$

$$= \frac{\frac{1}{2} + \frac{2}{N}\frac{R_E I}{V_t} + \left(\frac{R_E I}{V_t}\right)^2}{1 + \frac{R_E I}{V_t}} \cdot 4kTG_m +$$

$$\frac{\frac{1}{N} + \frac{2}{N}R_E\frac{I}{V_t} + \left(\frac{R_E I}{V_t}\right)^2}{\left(1 + \frac{R_E I}{V_t}\right)^2} \cdot \frac{K_F((1-a)I)^{A_F}}{f}$$

where $i_{n,out,w}$ is a white noise component, $i_{n,out,f}$ is a flicker noise component and $G_m$=I/($R_E$I+$V_t$) is an effective transconductance of the emitter degenerated output mirror 600. The first term in the preceding equation, a white noise term, illustrates that the approximation of the noise generated by the current mirror (4kT$G_m$) is acceptable for bipolar current mirrors. For low currents in which emitter degeneration is not yet active ($R_E$I/$V_t$<<1), a correction factor of 0.5 is used generally to accommodate the collector shot noise (2qI=2kT$G_m$) of the output NPN transistor Q2 612, the collector shot noise generating the largest share of the noise.

For larger currents in which emitter degeneration is significant, the correction factor approaches 1.0 since the noise is essentially the thermal noise (4kT/R=4kT$G_m$) of the degeneration transistor. For very large currents ($R_E$I/$V_t$>2/(1−α) for example $R_E$I>5 V for a typical transistor) the noise increases drastically due to the base noise current of the output NPN transistor Q2 612 and the generic current mirror model 300 no longer holds true.

The second term of the preceding equation is a flicker noise component and is ignored in the generic current mirror model 300. Emitter degeneration increases the flicker noise by a factor N.

Figure 7:
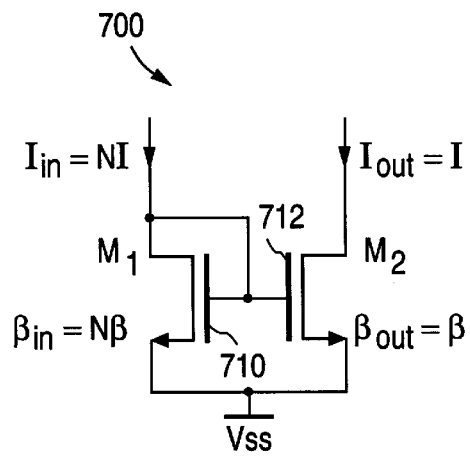
FIG. 7 depicts a schematic block diagram illustrating a metal oxide semiconductor (MOS) down scaling current mirror having a down scaling factor N.

Referring to FIG. 7, a schematic block diagram shows a metal oxide semiconductor (MOS) down scaling current mirror 700 having a down scaling factor N. A MOS transistor is advantageous since the transconductance $G_m$ varies with the transistor gain factor β, which is proportional to the transistor aspect ratio W/L, when operated in strong inversion. Therefore, the simple current mirror topology of the MOS current mirror 700 can be sized for a low transconductance $G_m$. The MOS current mirror 700 includes a first n-channel transistor M1 710 having a source supplying an input current $I_{in}$=NI, a gate connected to the drain, and a source connected to a VSS power source. The MOS current mirror 700 also includes a second n-channel transistor M2 712 having a source carrying an output current $I_{out}$=I, a gate connected to the gate of the first n-channel transistor M1 710, and a source connected to the VSS power source through a resistor $R_{out}$=$R_E$. A mirror ratio is obtained by scaling the transistor gain $β_{in}$ of the first n-channel transistor M1 710 ($β_{in}$=Nβ) to the transistor gain $β_{out}$ of the second n-channel transistor M2 712 ($β_{out}$=β). The output referred noise density of the MOS current mirror 700 is determined in accordance with an equation expressing a first-order approximation, as follows:

$$\overline{i^2_{n,out}} = \overline{i^2_{n,out,w}} + \overline{i^2_{n,out,f}}$$

$$= \frac{2}{3}\left(\frac{1}{N}+1\right) \cdot 4kTG_m + \left(\frac{1}{A_1} + \frac{1}{A_2}\right)K_F \frac{G_m^2}{f \cdot C_{OX}}$$

where $i_{n,out,w}$ is a white noise component, $i_{n,out,f}$ is a flicker noise component, and $A_1$ is a gate area of MOS transistor M1 710, $A_2$ is a gate area of MOS transistor M2 712, $K_F$ is a flicker noise coefficient, $C_{OX}$ is a capacitance per unit area of the gate oxide, $G_m$=min{I/nVp $\sqrt{2βI}$} is the transconductance of the output transistor operating in either weak or strong inversion, and n is the subthreshold slope factor typically in the range 1 to 2. I is the output current.

For the MOS current mirror 700, the white noise term is in good agreement with a 4kT$G_m$ approximation. In contrast to the emitter degenerated output mirror 600, the approximation for the MOS current mirror 700 holds over the full range of operation if a correction factor of ⅔ is introduced. If the n-channel transistors M1 710 and M2 712 change mode of operation from weak to strong inversion, $G_m$ changes so that the noise behavior also changes. The second term in the preceding equation is a flicker noise component. The value of flicker noise highly depends on transistor size. Flicker noise is proportional to the sum of the inverse gate areas (LW) of the n-channel transistors M1 710 and M2 712. Therefore, for a given total gate area, the flicker noise is minimized by distributing the area equally between the n-channel transistors M1 710 and M2 712. In various models, different equations are used to estimate the flicker noise. Herein the input referred flicker noise is independent of biasing.

Noise improvement is achieved by reducing the output transconductance $G_m$ of a current mirror. The emitter degenerated output mirror 600 achieves a low output transconductance $G_m$ by using a large emitter degeneration resistor $R_E$. The MOS current mirror 700 achieves a low output transconductance $G_m$ by implementing a low transistor gain factor β. Disadvantageously, a larger emitter degeneration and a low transistor gain factor reduce the maximum output current. Specifically, the maximum output current for a given voltage $V_{mir}$ across the output branch of a current mirror is determined for the degenerated bipolar current mirror 600 according to an equation, as follows:

$$I_{max} = \frac{V_{mir} - V_{CE,sat}}{R_E}$$
$$\cong \frac{V_{mir}}{R_E}$$

where $V_{CE,sat}$ is the saturation voltage of a bipolar transistor.

The maximum output current for a given voltage $V_{mir}$ across the output branch of a current mirror is determined for the MOS current mirror 700 according to an equation, as follows:

$$I_{max} = \frac{\beta}{2} V_{mir}^2.$$

For a filter having a topology such as the topology shown in FIG. 2, the output current mirrors of a current scaler drive a virtual ground node so that half the supply voltage is placed across the current mirror output branches. Consequently, to establish a suitable voltage margin, the current mirrors are advantageously designed so that the voltage across the output branches $V_{mir}$ is slightly below half the supply voltage (VDD−VSS)/2.

For the emitter degenerated output mirror 600, the resistance of the emitter degeneration resistor $R_E$ is determined from maximum current $I_{max}$ and mirror output voltage $V_{mir}$ by an equation, $R_E = V_{mir}/I_{max}$. For the MOS output mirror 700, the transistor gain factor β is determined from maximum current $I_{max}$ and mirror output voltage $V_{mir}$ by an equation, $\beta = 2 I_{max}/V^2_{mir}$. Since a large emitter degeneration resistor $R_E$ and a small transistor gain factor β advantageously result in a low output transconductance $G_m$ and a low noise, the mirror output voltage $V_{mir}$ is advantageously selected to be as large as possible, close to half the supply voltage.

Figure 8:
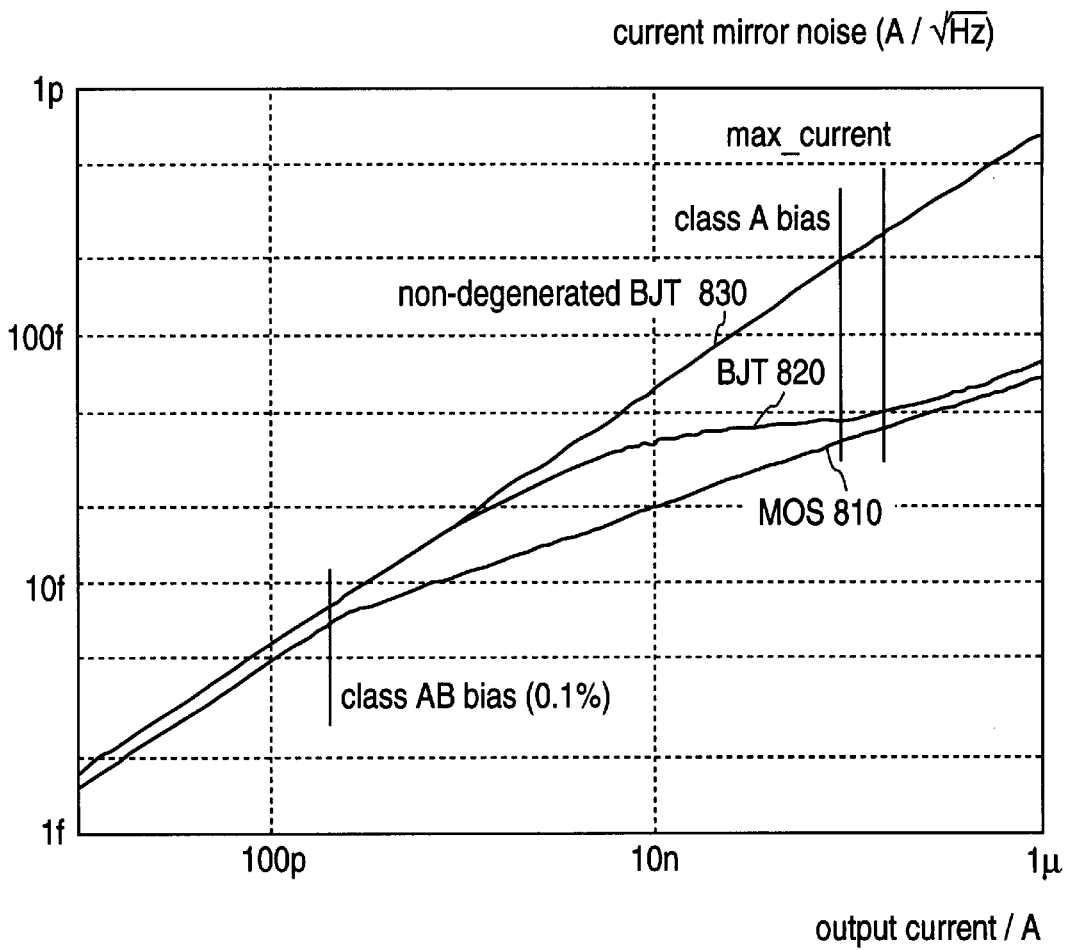
FIG. 8 is a graph which illustrates white noise current as a function of output current for three different current scaling mirror implementations including MOS, degenerated bipolar and simple bipolar current mirror implementations.

Referring to FIG. 8, a graph illustrates white noise current as a function of output current for three different current scaling mirror implementations (100:1) including MOS 810, degenerated bipolar 820 and simple bipolar 830 current mirror implementations. In this example, mirrors are sized to a minimum allowable output voltage $V_{mir}$ of 2V at a maximum output current $I_{max}$ of 200 nA. Vertical lines 840, 842 and 844 indicate maximum current and possible biasing levels for class A and class A/B operation. FIG. 8 shows that noise level is highly dependent on the output current level. Generally, the MOS output mirror 700 has a comparatively low noise level while the emitter degenerated output mirror 600 has a lower flicker noise. Note that flicker noise is not shown in FIG. 8.

Figure 9:
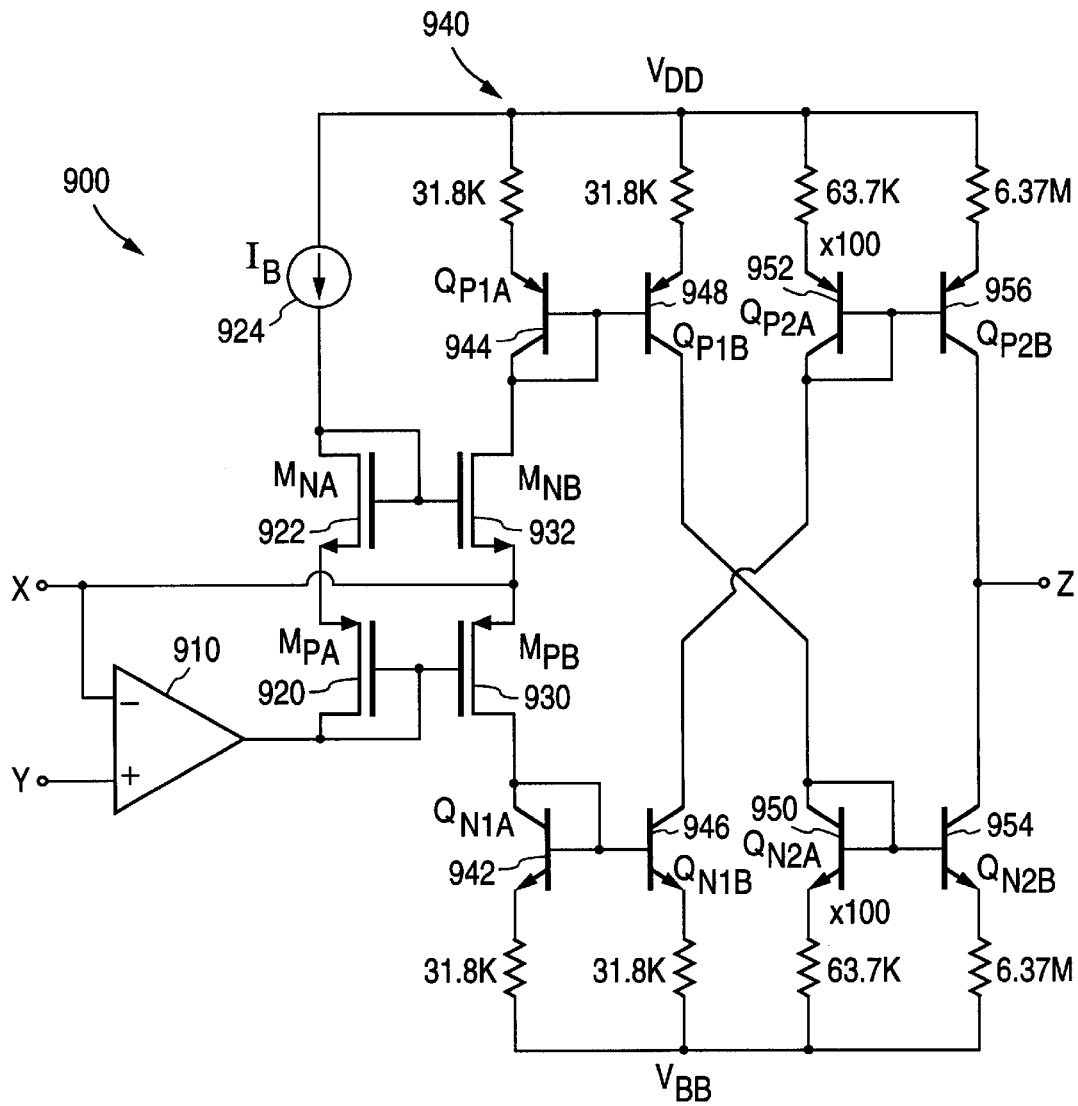
FIG. 9 is a schematic circuit diagram which illustrates a detailed bipolar implementation of a down scaling current conveyor CCII– for performing current scaling in a lowpass filter in accordance with an embodiment of the present invention.

Referring to FIG. 9, a schematic circuit diagram illustrates a detailed bipolar implementation of a down scaling current conveyor CCII− which can be used to perform current scaling in a filter based on the topology of filter 200 shown in FIG. 2. The CCII− 900 includes an operational amplifier 910 having an inverting input terminal, a noninverting input terminal and an output terminal. A P-channel MOS biasing transistor $M_{PA}$ 920 has a drain and a gate connected to the output terminal of the operational amplifier 910, and has a source connected to a source of an N-channel MOS biasing transistor $M_{NA}$ 922. The N-channel MOS biasing transistor $M_{NA}$ 922 also has a gate and drain which are interconnected and connected to the supply voltage VDD through a bias current source $I_B$ 924. The MOS biasing transistors $M_{PA}$ 920 and $M_{NA}$ 922 are added to the CCII− 900 to properly bias the output stage formed by MOS output stage transistors $M_{PB}$ 930 and $M_{NB}$ 932. The P-channel MOS output stage transistor $M_{PB}$ 930 has a drain connected to the supply voltage VSS through an NPN transistor $Q_{N1A}$ 942 of a current mirror circuit 940, a gate connected to the gate of the P-channel MOS biasing transistor $M_{PA}$ 920, and a source connected to the inverting terminal of the operational amplifier 910 at an X-terminal of the CCII− 900. The N-channel MOS output stage transistor $M_{NB}$ 932 has a drain connected to the supply voltage VDD through a PNP transistor $Q_{P1A}$ 944 of the current mirror circuit 940, a gate connected to the gate of the N-channel MOS biasing transistor $M_{NA}$ 922, and a source connected to the inverting terminal of the operational amplifier 910 at the source of MOS output stage transistor $M_{PB}$ 930.

The biasing current $I_B$ from the bias current source $I_B$ 924 determines the quiescent current of the CCII− 900. The biasing current $I_B$ also determines the limit of the X-terminal current that can be sourced or sinked in a class A filter operation. For example, if the current flowing into the X-terminal exceeds twice the biasing current $I_B$, then the current conducting through N-channel MOS transistor $M_{NB}$ 932 approaches zero so that the CCII− 900 enters class B operation.

The current mirror circuit 940 includes the NPN transistor $Q_{N1A}$ 942 which has a collector and a base interconnected and connected to the drain of P-channel MOS output stage transistor $M_{PB}$ 930 and has an emitter connected to supply voltage VSS through a resistor $R_{N1A}$. The current mirror circuit 940 also includes the PNP transistor $Q_{P1A}$ 944 which has a collector and a base interconnected and connected to the drain of N-channel MOS output stage transistor $M_{NB}$ 932 and has an emitter connected to supply voltage VDD through a resistor $R_{P1A}$. The current mirror circuit 940 also includes an NPN transistor $Q_{N1B}$ 946, an NPN transistor $Q_{N2A}$ 950, an NPN transistor $Q_{N2B}$ 954, a PNP transistor $Q_{P1B}$ 948, a PNP transistor $Q_{P2A}$ 952, and a PNP transistor $Q_{P2B}$ 956. The NPN transistor $Q_{N1B}$ 946 has a base connected to the base of the NPN transistor $Q_{N1A}$ 942, a collector and an emitter connected to supply voltage VSS through a resistor $R_{N1B}$. The PNP transistor $Q_{P1B}$ 948 has a base connected to the base of the PNP transistor $Q_{P1A}$ 944, a collector and an emitter connected to supply voltage VDD through a resistor $R_{P1B}$. The NPN transistor $Q_{N2A}$ 950 has a collector and a base which are interconnected and connected to the collector of the PNP transistor $Q_{P1B}$ 948, and an emitter connected to supply voltage VSS through a resistor $R_{N2A}$. The PNP transistor $Q_{P2A}$ 952 has a collector and a base which are interconnected and connected to the collector of the NPN transistor $Q_{N1B}$ 946, and an emitter connected to supply voltage VDD through a resistor $R_{P2A}$. The NPN transistor $Q_{N2B}$ 954 has a base connected to the base of the NPN transistor $Q_{N2A}$ 950, a collector connected to the collector of PNP transistor $Q_{P2B}$ 956 at an output Z-terminal of the CCII− 900 and an emitter connected to supply voltage VSS through a resistor $R_{N2B}$. The PNP transistor $Q_{P2B}$ 956 has a base connected to the base of the PNP transistor $Q_{P2A}$ 952, a collector connected to the collector of NPN transistor $Q_{N2B}$ 954 at an output Z-terminal of the CCII− 900 and an emitter connected to supply voltage VDD through a resistor $R_{P2B}$.

The 1:1 current mirror circuit 940 is added to realize the CCII− polarity. The plurality of transistors in the current mirror circuit 940 are scaled in emitter area using one unit transistor for each output transistor (for example, NPN transistor $Q_{N2B}$ 954 and PNP transistor $Q_{P2B}$ 956) with a corresponding input transistor (respectively, NPN transistor $Q_{N2A}$ 950 and PNP transistor $Q_{P2A}$ 952) having N unit transistors connected in parallel to achieve a high accuracy. The emitter area scaling results in large area consumption and large parasitics. Alternatively, the large emitter area ratio is optionally produced by inserting a log N $V_t$ voltage source in the base-emitter loop of the current mirror where $V_t$ is the thermal voltage having a value of approximately 25 mV at 25° C.

Figure 10:
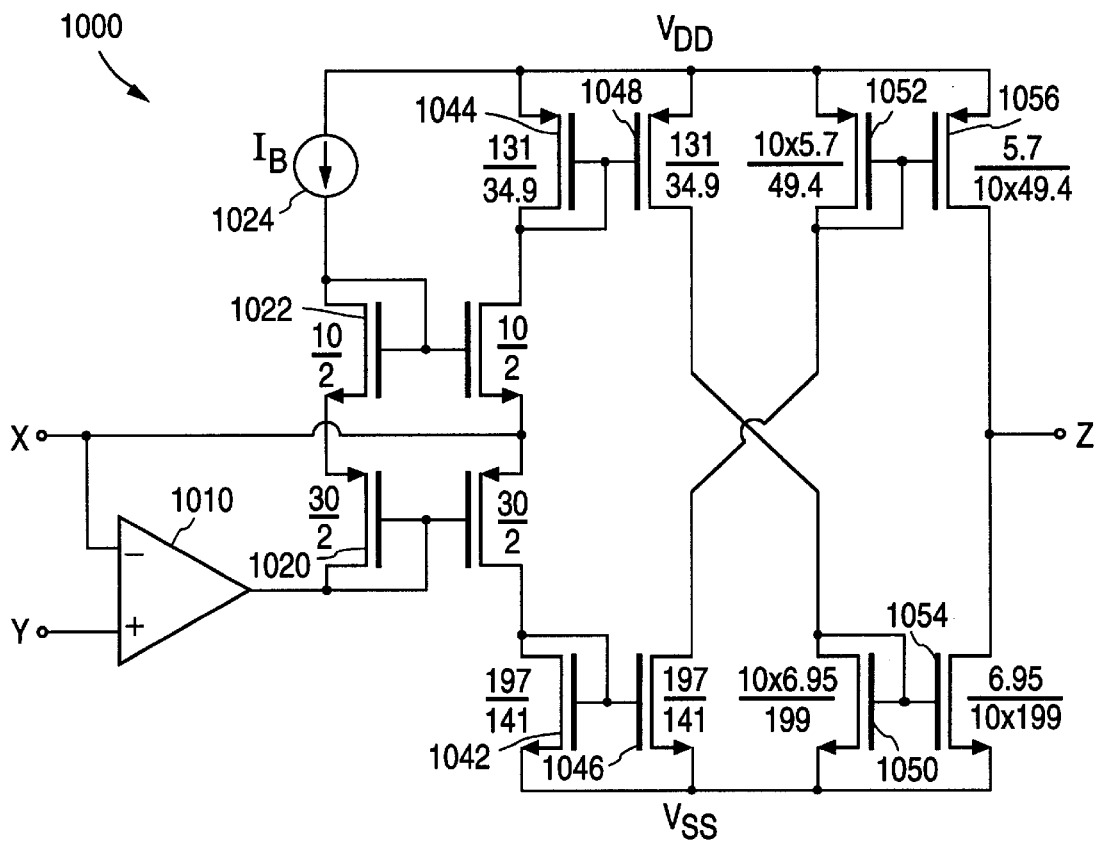
FIG. 10 is a schematic circuit diagram which illustrates a MOS implementation of a down scaling current conveyor CCII– for performing current scaling in a CCII– lowpass filter in accordance with an embodiment of the present invention.

Referring to FIG. 10, a schematic circuit diagram illustrates a MOS implementation of a down scaling current conveyor MOS CCII− which is used to perform current scaling in a filter based on the topology of filter 200 shown in FIG. 2. The MOS CCII− 1000 includes an operational amplifier 1010 having an inverting input terminal, a noninverting input terminal and an output terminal. A P-channel MOS biasing transistor $M_{PA}$ 1020 has a drain and a gate connected to the output terminal of the operational amplifier 1010, and has a source connected to a source of an N-channel MOS biasing transistor $M_{NA}$ 1022. The N-channel MOS biasing transistor $M_{NA}$ 1022 also has a gate and drain which are interconnected and connected to the supply voltage VDD through a bias current source $I_B$ 1024. The MOS biasing transistors $M_{PA}$ 1020 and $M_{NA}$ 1022 are added to the MOS CCII− 1000 to properly bias the output stage formed by MOS output stage transistors $M_{PB}$ 1030 and $M_{NB}$ 1032. The P-channel MOS output stage transistor $M_{PB}$ 1030 has a drain connected to the supply voltage VSS through an N-channel MOS transistor 1042 of a current mirror circuit 1040, a gate connected to the gate of the P-channel MOS biasing transistor $M_{PA}$ 1020, and a source connected to the inverting terminal of the operational amplifier 1010 at an X-terminal of the MOS CCII− 1000. The N-channel MOS output stage transistor $M_{NB}$ 1032 has a drain connected to the supply voltage VDD through a P-channel MOS transistor 1044 of the current mirror circuit 1040, a gate connected to the gate of the N-channel MOS biasing transistor $M_{NA}$ 1022, and a source connected to the inverting terminal of the operational amplifier 1010 at the source of MOS output stage transistor $M_{PB}$ 1030.

The current mirror circuit 1040 includes the N-channel MOS transistor 1042 which has a drain and a gate interconnected and connected to the drain of P-channel MOS output stage transistor $M_{PB}$ 1030 and has a source connected to supply voltage VSS. The current mirror circuit 1040 also includes the P-channel MOS transistor 1044 which has a drain and a gate interconnected and connected to the drain of N-channel MOS output stage transistor $M_{NB}$ 1032 and has a source connected to supply voltage. The current mirror circuit 1040 also includes an N-channel MOS transistor 1046, an N-channel MOS transistor 1050, an N-channel MOS transistor 1054, a P-channel MOS transistor 1048, a P-channel MOS transistor 1052, and a P-channel MOS transistor 1056. The N-channel MOS transistor 1046 has a gate connected to the gate of the N-channel MOS transistor 1042, a drain and a source connected to supply voltage VSS. The P-channel MOS transistor 1048 has a gate connected to the gate of the P-channel MOS transistor 1044, a drain and a source connected to supply voltage VDD. The N-channel MOS transistor 1050 has a drain and a gate which are interconnected and connected to the drain of the P-channel MOS transistor 1048, and a source connected to supply voltage VSS. The P-channel MOS transistor 1052 has a drain and a gate which are interconnected and connected to the drain of the N-channel MOS transistor 1046, and a source connected to supply voltage VDD. The N-channel MOS transistor 1054 has a gate connected to the gate of the N-channel MOS transistor 1050, a drain connected to the drain of P-channel MOS transistor 1056 at an output Z-terminal of the MOS CCII− 1000 and a source connected to supply voltage VSS. The P-channel MOS transistor 1056 has a gate connected to the gate of the P-channel MOS transistor 1052, a drain connected to the drain of N-channel MOS transistor 1054 at an output Z-terminal of the MOS CCII− 1000 and a source connected to supply voltage VDD.

The flicker noise component of the MOS CCII− 1000 is heavily affected by the size of the gate area. To obtain a reduced flicker noise—substantially the lowest possible signal noise for a given gate area, the gate areas of the MOS transistors in the current mirror 1040 are carefully distributed, taking into account $K_F$ values of the transistor types and the different biasing conditions of the current mirrors. In one embodiment having a fixed total gate area ($A_{tot}$), an advantageous area distribution for reducing flicker noise is determined using a method of Lagrange Multipliers by equations, as follows:

$$(WL)_{N1} = \frac{A_{tot}\sqrt{K'_{FN}}\, V_{eff2}}{2\left(\sqrt{K'_{FN}} + \sqrt{K'_{FP}}\right)(V_{eff1} + V_{eff2})}$$

$$(WL)_{N2} = \frac{A_{tot}\sqrt{K'_{FN}}\, V_{eff1}}{2\left(\sqrt{K'_{FN}} + \sqrt{K'_{FP}}\right)(V_{eff1} + V_{eff2})}$$

$$(WL)_{P1} = \frac{A_{tot}\sqrt{K'_{FP}}\, V_{eff2}}{2\left(\sqrt{K'_{FN}} + \sqrt{K'_{FP}}\right)(V_{eff1} + V_{eff2})}$$

$$(WL)_{P2} = \frac{A_{tot}\sqrt{K'_{FP}}\, V_{eff1}}{2\left(\sqrt{K'_{FN}} + \sqrt{K'_{FP}}\right)(V_{eff1} + V_{eff2})}$$

where $V_{eff1}$ is the saturation voltage $((V_{gs}-V_T)=V_{ds})$ of the first mirrors (P-channel MOS transistors 1044 and 1048 and N-channel MOS transistors 1042 and 1044) and $V_{eff2}$ is the saturation voltage $((V_{gs}-V_T)=V_{ds})$ of the output mirrors (P-channel MOS transistors 1052 and 1056 and N-channel MOS transistors 1050 and 1054). $K'_{FN}$ and $K'_{FN}$ are flicker coefficients of the N-channel and P-channel MOS transistors, respectively.

The CCII− 900 and the MOS CCII− 1000 shown in FIGS. 9 and 10, and other filter embodiments using the generic current mirror model 300 shown in FIG. 3, utilize a high current mirror input impedance to reduce noise. The high current mirror input impedance has a side effect of increasing voltage swing at mirror inputs. This voltage swing is naturally limited by the supply voltages. Current mirrors typically have a substantially linear input impedance, at least when operating in class A. For example the lowpass filter 200 shown in FIG. 2, when biased at the limit of class A operation, has a theoretical lower limit for current mirror output transconductance $G_m$ of 1/R. However, the previously derived equation shows a noise improvement exists only when:

$$\frac{1}{N} + G_m R < 1.$$

Thus noise improvements are not expected using class A biasing.

However, a sufficiently high $G_m$ is achieved at a maximum current flow while having a low $G_m$ in the quiescent state by utilizing the inherent non-linearity of the current mirror transistors. A low transistor transconductance $G_m$ is generally obtained at low current levels resulting in low noise levels, so that class A/B operation is utilized to reduce quiescent state transconductance $G_m$ and the noise that results from the transconductance $G_m$.

Figure 11A:
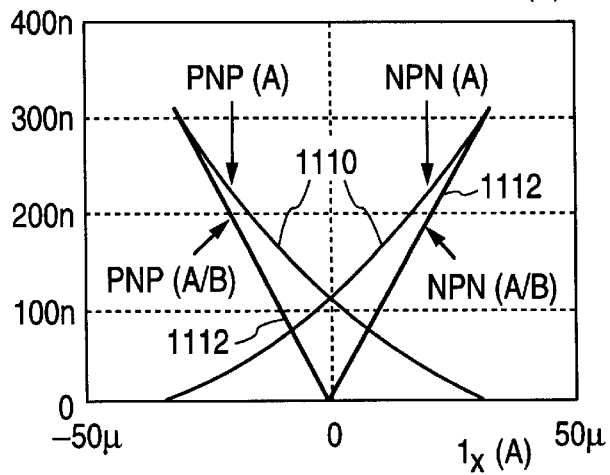
FIGS. 11(A) and 11(B) depict a mirror output current graph and a mirror input voltage graph, respectively, which illustrate simulated DC transfer curves produced by a bipolar lowpass filter during class A and class A/B operation.
Figure 11B:
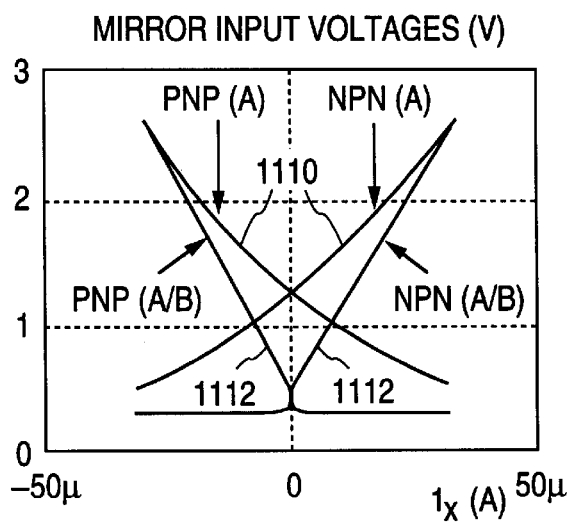

Referring to FIGS. 11(A) and 11(B), a mirror output current graph and a mirror input voltage graph respectively illustrate simulated DC transfer curves produced by the CCII– 900 illustrated in FIG. 9 during both class A and class A/B operation. Mirror input voltage curves for class A operation 1110 and for class A/B operation 1112 illustrate that the slope in the region of the quiescent state is much steeper in class A/B operation, indicating that the resistance $R_m$ is higher and the transconductance $G_m$ is lower in class A/B operation and resulting in a better noise performance near the quiescent state. Noise improvement resulting from class A/B operation is primarily enhanced in the region of the quiescent state. Noise at full scale current levels does not generally depend on the implemented biasing scheme. At higher signal levels, such as levels attained entering class B operation, mirror currents have magnitudes in the range of signal current levels. Consequently, current mirror noise becomes signal dependent as shown by curves in FIG. 8 for signals equal and greater than the biasing level.

In the lowpass filter 200 shown in FIG. 2, the signal current flowing in the current scaler has a magnitude given by an equation, as follows:

$$I_{out} = \frac{1}{N} \cdot \frac{V_{IN} + V_{OUT}}{R'}$$
$$= \frac{sRC}{sRC+1} \cdot \frac{V_{IN}}{R}.$$

Accordingly, the current flowing in the current scaler depends on the filter input voltage. The output current $I_{out}$ is a highpass filtered version of the input signal so that the output current $I_{out}$ has a strong frequency dependence and strong signal components well inside the passband are attenuated and do not seriously affect the current levels in the CCII circuit. Primarily strong signal components near the cutoff frequency and higher in frequency determine the current levels, and thus the noise, in the CCII topology.

In class A/B operation, the current mirrors exhibit single-pole roll-off at frequencies of $f_{pole} = G_{m,in}/2\pi C_{in,mir}$, where $G_{m,in}$ is the transconductance of the input transistor of the current mirror and $C_{in,mir}$ is the current mirror input capacitance. At low current levels, input capacitances are generally independent of current. In bipolar current mirrors, the input capacitance is substantially equal to the collector-to-substrate junction capacitance which is current independent. In MOS current mirrors, the input capacitance is substantial equal to the total gate capacitance of the current mirror transistors. The transconductance of the current mirror input transistors is highly current dependent so that the current mirror pole frequencies are lowered as the current level is reduced, resulting in poor high frequency behavior. The high frequency parasitic poles depend on the current level and are therefore signal dependent during class A/B operation.

Figure 1:
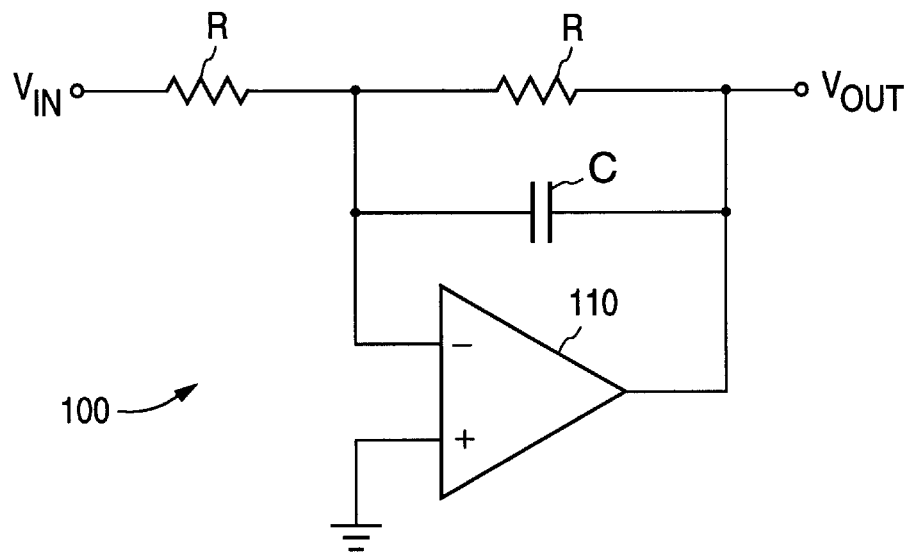
FIG. 1, labeled PRIOR ART, is a schematic block diagram showing a conventional, or reference, lowpass filter.

Several first-order 100 Hz lowpass filter topologies have been simulated to illustrate the improvement achieved by the described noise reduction method. The simulated topologies include the reference filter 100 shown in FIG. 1, and several current-scaling filters designed using the topology of the lowpass filter 200 shown in FIG. 2. The reference filter 100 is simulated using a feedback capacitance of 100 pF and two resistors R, each having a resistance of 15.9 MΩ. The lowpass filter 200 is simulated using a feedback capacitance of 100 pF and two scaled resistors R', each having a resistance of 159 KΩ, and a scaling factor of N=100.

Figure 12:
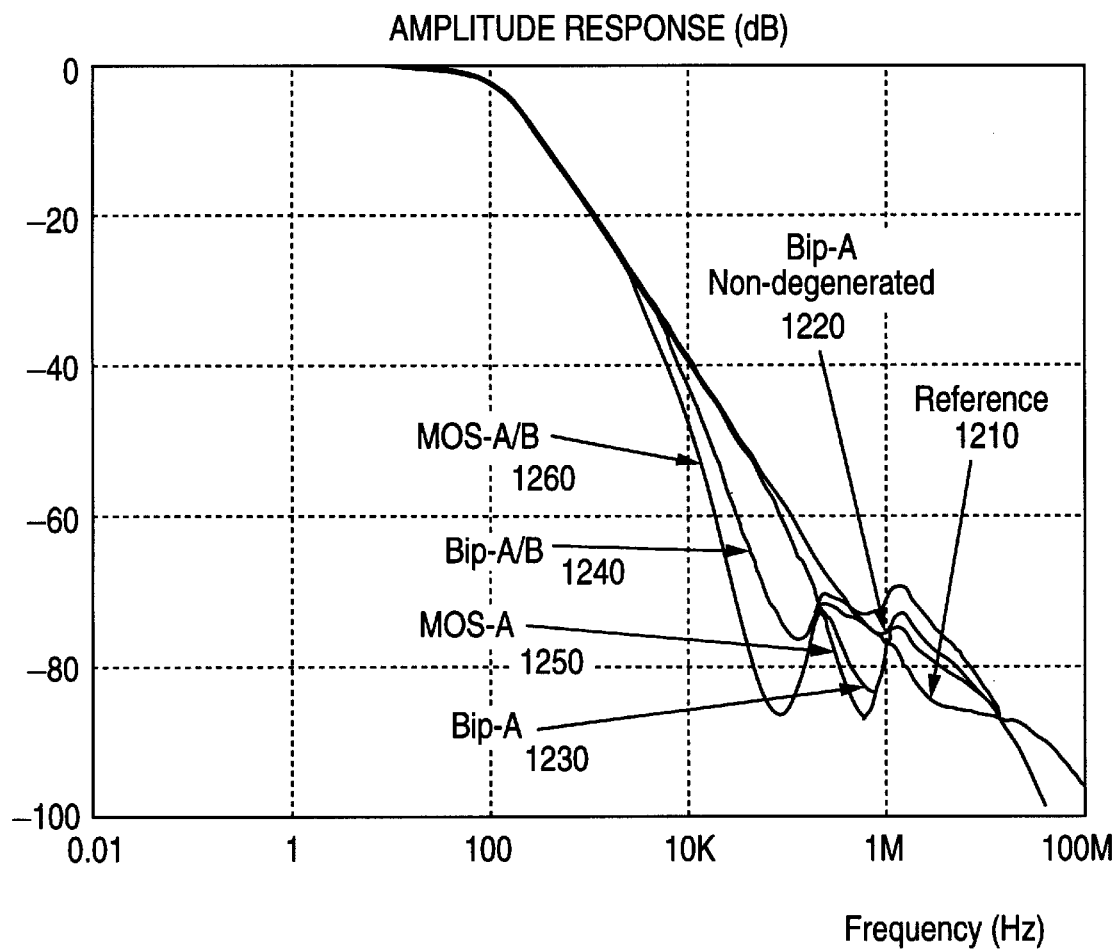
FIG. 12 depicts a graph of simulated frequency responses showing the performance of different lowpass filter implementations.

Referring to FIG. 12, a graph of simulated frequency responses shows the performance of different lowpass filter implementations. The simulated frequency responses include the response of the reference filter 1210. The simulated frequency responses also include responses of the several current-scaling filters include a nondegenerated bipolar CCII filter operating in class A 1220, a degenerated bipolar CCII filter operating in class A 1230, a degenerated bipolar CCII filter operating in class A/B biased at 0.1% of the maximum current 1240, a MOS CCII filter operating in class A 1250, and a MOS CCII filter operating in class A/B biased at 0.1% of the maximum current 1260. The several filters show generally equivalent frequency responses within normal frequencies of interest. However, frequencies in the stop band, especially filters operating in class A/B, deviate from the response of the reference filter 1210 due to the parasitic poles introduced by the CCII topology and originating from the current mirrors and the internal operational amplifier.

Figure 13:
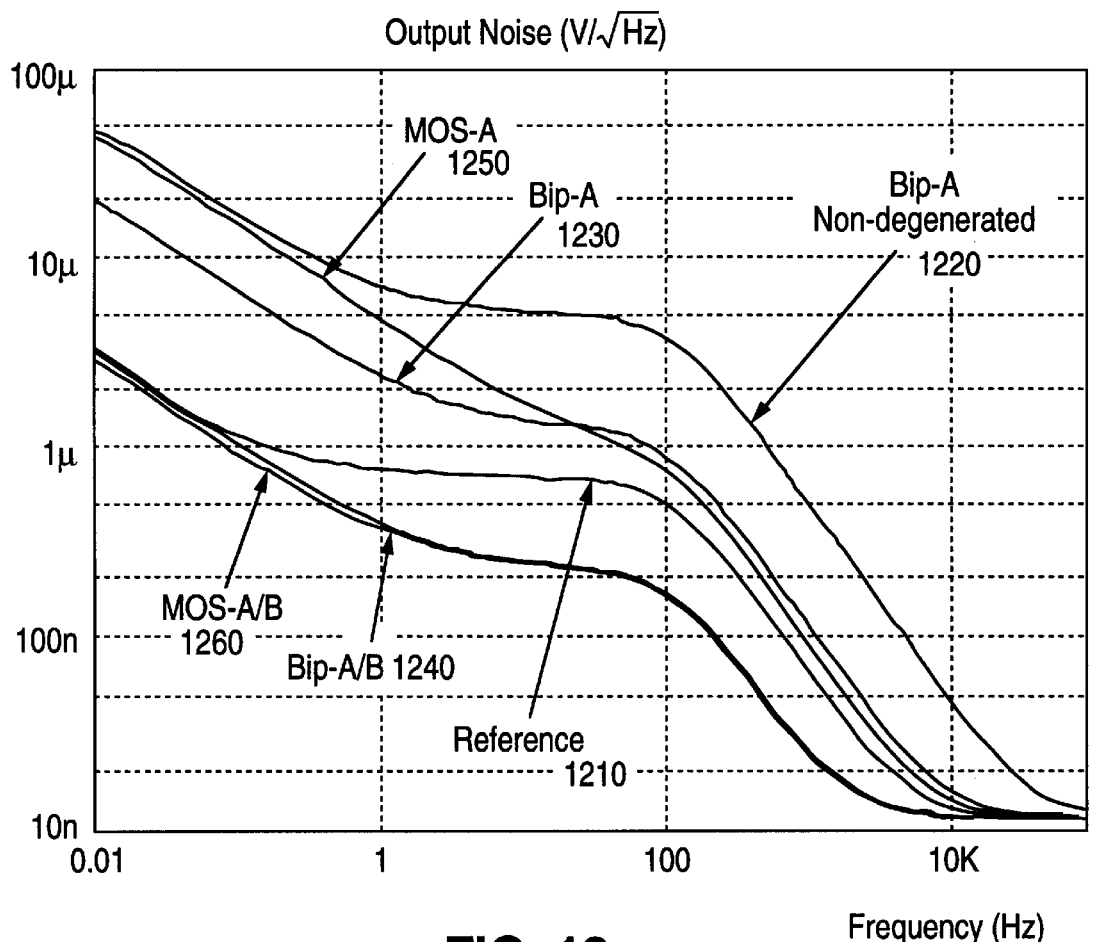
FIG. 13 depicts a graph of simulated noise spectra showing the noise performance of different lowpass filter implementations.

Referring to FIG. 13, a graph of simulated noise spectra shows the noise performance of different lowpass filter implementations. The two class A/B implementations, specifically the degenerated bipolar CCII filter operating in class A/B biased at 0.1% of the maximum current 1240 and the MOS CCII filter operating in class A/B biased at 0.1% of the maximum current 1260, show the lowest noise level. The class A implementations, specifically the nondegenerated bipolar CCII filter operating in class A 1220, the degenerated bipolar CCII filter operating in class A 1230, and the MOS CCII filter operating in class A 1250, show higher noise levels even compared to the reference filter noise level 1210. The nondegenerated bipolar CCII filter operating in class A 1220 shows the highest noise level. For the class A/B implementations and the reference filter 1210, the flicker noise levels are substantially the same, indicating that flicker noise is not current mirror related, but rather originates from the "noisy" virtual ground terminating the filter resistors. The noisy virtual ground is the filter operational amplifier ground input in the reference filter 1210. The noisy virtual ground is the CCII operational amplifier virtual ground input in the current-scaled filters. The flicker noise levels are determined predominantly by the operational amplifier, indicating that MOS-based CCII current mirror implementations implemented using a smaller area would not affect the 1/f flicker noise performance when operating in class A/B. A smaller gate area could be used without having the flicker noise of the current mirrors dominate the total flicker noise. TABLE I illustrates a summary of noise behavior of the simulated filter topologies.

TABLE I

| Filter Topology | Total Noise (1 m–10 KHz) | Noise: $N/\sqrt{2kT/C}$ | Dynamic Range ($V_{max.out}$ = 2 V) |
| --- | --- | --- | --- |
| Reference Filter | 9.23 $\mu V_{RMS}$ | +0.27 dB | 103.7 dB |
| Non-degenerated bipolar CCII class A | 66.36 $\mu V_{RMS}$ | +17.41 dB | 86.6 dB |
| Degenerated bipolar CCII class A | 17.46 $\mu V_{RMS}$ | +5.81 dB | 98.2 dB |
| Degenerated bipolar CCII class A/B | 3.47 $\mu V_{RMS}$ | −8.22 dB | 112.2 dB |
| MOS CCII class A | 19.84 $\mu V_{RMS}$ | +6.92 dB | 97.1 dB |
| MOS CCII Class A/B | 3.45 $\mu V_{RMS}$ | −8.27 dB | 112.3 dB |

TABLE lists, for comparison, the total output noise and the dynamic range in the frequency range from 1 mHz to 10 KHz, a frequency range that includes substantially all significant noise signals including thermal noise of the filter operational amplifier. TABLE I also lists output noise for comparison. Noise improvement of at least 8 dB is obtained using the MOS CCII class A/B implementations. Advantageously, the reduced noise levels are obtained by the MOS CCII class A/B implementations using a relatively small capacitor. To achieve the same noise level using the reference filter 100 topology would necessitate usage of a capacitor that is approximately six times larger.

With respect to the simulation, all current conveyors (CCII) are sized to allow a full signal swing at the filter input so that noise reductions translate directly to dynamic range improvements, as shown in TABLE I. Large signal frequency responses are derived using Hspice transient analysis and a 2 V input amplitude. The simulated filter implementations show less than 0.05 dB deviation from ideal behavior in the 10–1000 Hz range.

Figure 14:
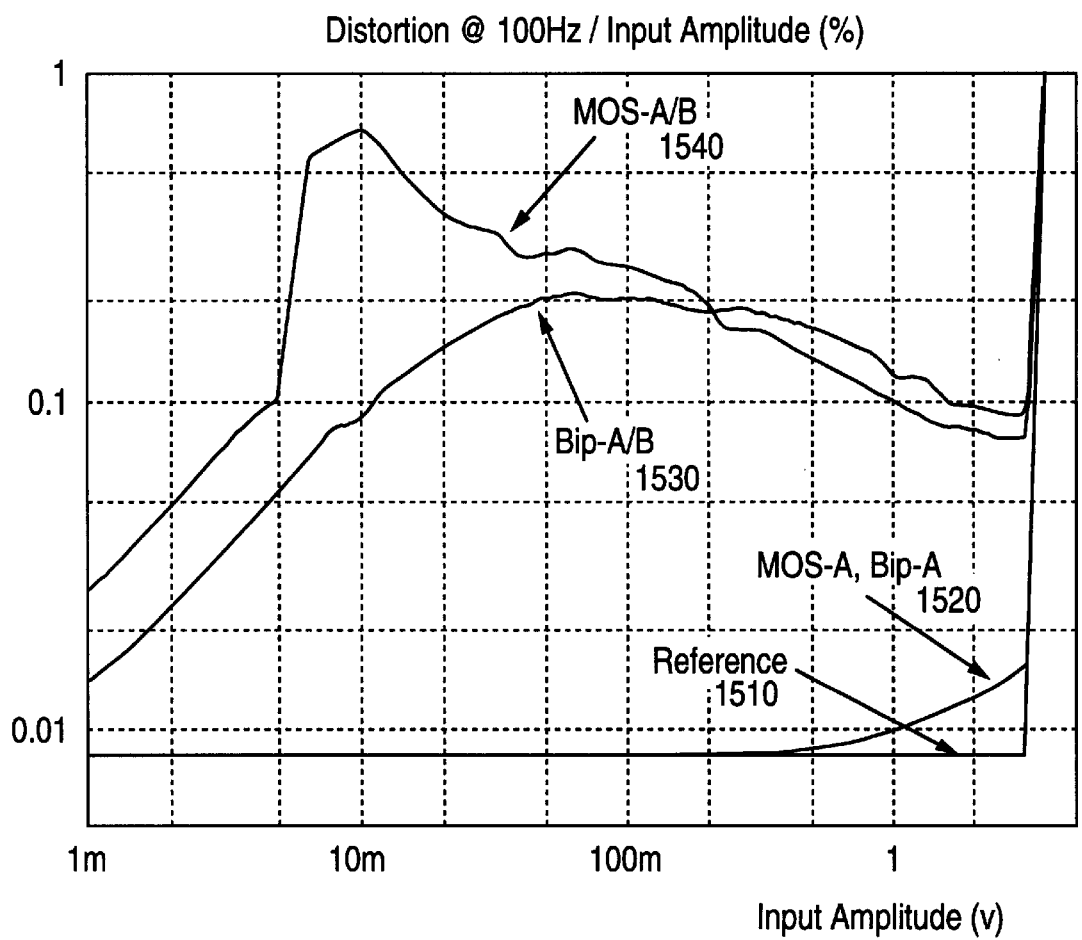
FIG. 14 shows a graph of simulated distortion plotted against input amplitude of different lowpass filter implementations.

Referring to FIG. 14, a graph of simulated distortion is plotted against input amplitude of different lowpass filter implementations showing an increased distortion level of the MOS CCII class A/B implementations. The different filter implementations are simulated in the time domain using Hspice with a worst-case combination of typical device mismatches. In one embodiment, MOS current mirrors we assumed to have $V_T$ mismatches of 1 mV and $\beta$ mismatches of 0.1%. In another embodiment, bipolar current mirrors are assumed to have $V_{BE}$ mismatches of 0.5 mV and $R_E$ mismatches of 0.2%. The exemplary MOS and bipolar embodiments are analyzed assuming an optimized layout for purposes of comparison. Circuit parameters and characteristics are assumed to be substantially equivalent. Individual mismatches are chosen so that gains in the positive and negative signal paths are increased and decreased, respectively. The reference filter 1510 and the class A filters 1520 have a very low distortion of less than approximately 0.01% originating primarily from the operational amplifier. The bipolar CCII class A/B filter 1530 and the MOS CCII class A/B filter 1540 generate less than 1% distortion and the maximum distortion occurs for input amplitudes on the order of 10 mV, which is where the current conveyor CCII enters class A/B operation. The apparent peak distortion of the MOS CCII class A/B filter is enhanced by a well-known discontinuity at the weak-to-strong inversion transition point of the Spice simulation model. True distortion is likely less severe.

Figure 15A:
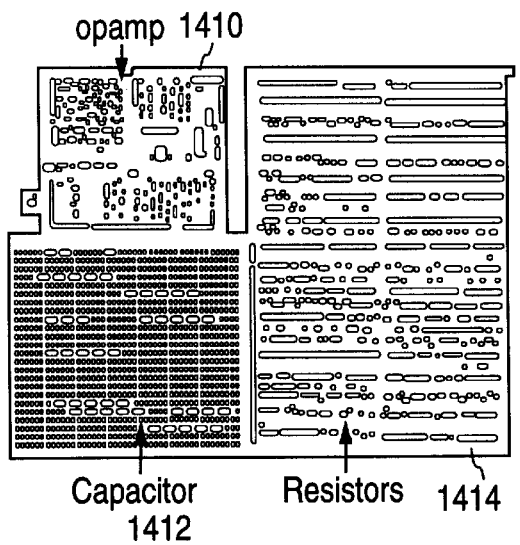
FIGS. 15(A) and 15(B) illustrate plan views of integrated circuit chip layouts for a reference filter and a MOS CCII filter, respectively.
Figure 15B:
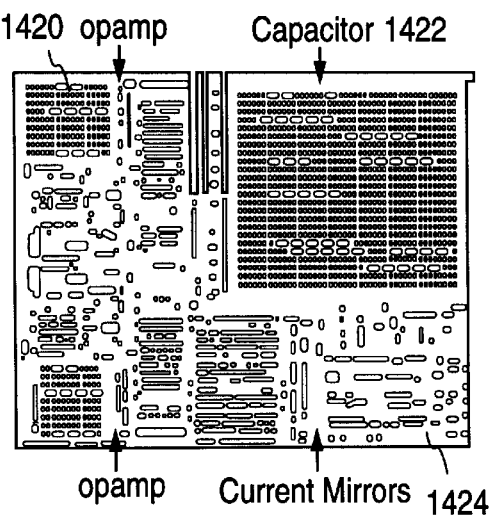

A comparison of estimated integrated circuit area consumption is shown in FIGS. 15(A) and 15(B). FIG. 15(A) is a plan view of an integrated circuit chip layout for the reference filter including areas for an operational amplifier 1410, a capacitor 1412 and resistors 1414. FIG. 15(B) is a plan view of an integrated circuit chip layout for the MOS CCII filter including areas for an operational amplifier 1420, a capacitor 1422 and current mirrors 1424. FIGS. 15(A) and 15(B) illustrate that, for a given chip area, the current scaler using class A/B biasing achieves an improved noise performance with substantially no penalty in circuit area consumption.

The significant improvement in noise performance of the bipolar CCII class A/B filter 1530 and the MOS CCII class A/B filter 1540 are obtained at a cost of an increased power consumption partially due to inclusion of the current conveyor CCII circuit which adds the bias current of the current mirrors and the additional operation amplifier to the power consumption. In addition, the smaller filter resistance values force a higher bias current in the output stage of an operational amplifier topology to allow a full voltage swing. Furthermore, for the current scaling to reduce noise, a high input stage transconductance is used so that the input noise level is held significantly lower than the noise of the filter resistors. In the simulated embodiments, the reference filter consumes approximately 50 $\mu$A, the class A filters consume about 150 $\mu$A and the class A/B filters consume approximately 100 $\mu$A.

While the invention has been described with reference to various embodiments, it will be understood that these embodiments are illustrative and that the scope of the invention is not limited to them. Many variations, modifications, additions and improvements of the embodiments described are possible. Specifically, the specification describes a first order lowpass filter topology for illustrative purposes only, to clearly state methods and structures for improving the noise performance of filters in general. These methods and structures are easily extended to other types of filters including higher order filters. Furthermore, the specification uses a traditional RC filter topology for analysis. This is done to simplify and more clearly present the analysis. The technique described herein is useful for all continuous time filter topologies and is not limited to traditional RC filter topologies.

What is claimed is:

1. A current mirror model comprising:

an input branch for receiving an input voltage $V_{in}$ at an input terminal for supplying said voltage $V_{in}$ to a series circuit including a voltage source and a resistor of resistance value $R_m$, said voltage source having a voltage value substantially equal to a value $4kTR_m$, where k is the Boltzmann constant, and T is an operating temperature; and an output branch coupled to the input branch for providing an output current at an output terminal, the output branch having (a) a first current source controlled by the voltage $V_{in}$ for sourcing a first current substantially equal to a transconductance $G_m$ of said output branch times the voltage $V_{in}$, the output branch transconductance $G_m$ having a transconductance value substantially less than a value of an input branch conductance $1/R_m$; and (b) a second current source coupled in parallel to said first current source, said second current source sourcing a second current substantially equal to the value $4kTG_m$.

* * * * *

UNITED STATES PATENT AND TRADEMARK OFFICE
CERTIFICATE OF CORRECTION

PATENT NO.     :   5,926,060
ISSUE DATE     :   July 20, 1999
INVENTOR(S)    :   Olgaard, Christian; Nielsen, Ivan R.

It is certified that error appears in the above-identified patent and that said Letters Patent is hereby corrected as shown below:

Title page, item [54] and column 1, line 1, before "MIRROR" insert --CURRENT--.

At col. 5, line 51, after "CCII+" delete "0".

Signed and Sealed this

Fifteenth Day of February, 2000

*Attest:*

Q. TODD DICKINSON

*Attesting Officer*     Commissioner of Patents and Trademarks